(12) United States Patent
Lei (10) Patent No.: US 11,024,762 B2
(45) Date of Patent: Jun. 1, 2021

(54) SUBSTRATE PROCESSING SYSTEM, SUBSTRATE CONVEYING DEVICE AND CONVEYING METHOD

(71) Applicant: Lawrence Chung-Lai Lei, Milpitas, CA (US)

(72) Inventor: Lawrence Chung-Lai Lei, Milpitas, CA (US)

(73) Assignee: Lawrence Chung-Lai Lei, Milpitas, CA (US)

( * ) Notice: Subject to any disclaimer, the term of this patent is extended or adjusted under 35 U.S.C. 154(b) by 203 days.

(21) Appl. No.: 15/872,915

(22) Filed: Jan. 16, 2018

(65) Prior Publication Data

US 2018/0287007 A1    Oct. 4, 2018

(30) Foreign Application Priority Data

Mar. 28, 2017   (CN) .......................... 201710193126.9

(51) Int. Cl.
*H01L 21/677* (2006.01)
*H01L 31/18* (2006.01)
*B65G 47/22* (2006.01)
*H01L 21/67* (2006.01)

(52) U.S. Cl.
CPC .......... *H01L 31/1876* (2013.01); *B65G 47/22* (2013.01); *H01L 21/67161* (2013.01); *H01L 21/67742* (2013.01); *H01L 21/67745* (2013.01); *H01L 21/67766* (2013.01); *H01L 31/18* (2013.01); *H01L 31/1804* (2013.01); *Y02P 70/50* (2015.11)

(58) Field of Classification Search
CPC ............ B25J 15/0014; H01L 21/67754; H01L 21/67781; H01L 21/67161; H01L 21/67742; H01L 21/67745; H01L 21/67766; H01L 31/18; H01L 31/1804; H01L 31/1876; B65G 47/22
See application file for complete search history.

(56) References Cited

U.S. PATENT DOCUMENTS

| | | | | |
|---|---|---|---|---|
| 8,276,959 B2 * | 10/2012 | Kim | ..................... | B25J 15/0052 |
| | | | | 294/183 |
| 8,465,072 B2 * | 6/2013 | Wu | ...................... | B65G 49/067 |
| | | | | 294/213 |
| 9,412,638 B2 * | 8/2016 | Pergande | .......... | H01L 21/68707 |
| 2010/0087028 A1 * | 4/2010 | Porthouse | ......... | H01L 21/67069 |
| | | | | 438/61 |

(Continued)

OTHER PUBLICATIONS

Foreign Office Action dated Feb. 20, 2019 for Taiwanese Appin. No. 107110292.

*Primary Examiner* — Saul Rodriguez
*Assistant Examiner* — Brendan P Tighe
(74) *Attorney, Agent, or Firm* — Vista IP Law Group, LLP (57) ABSTRACT

A conveying device for conveying at least a first row of substrates and a second row of substrates, includes: a conveying fork having a main body and a plurality of branches, a first end of each of the branches is connected to the main body, and a second end of each of the branches is a free end; wherein a first branch of the plurality branches has a first plurality of grooves, and a second branch of the plurality of branches has a second plurality of grooves; and wherein one of the first plurality of grooves and one of the second plurality of grooves are configured to support one of the substrates in the first row.

25 Claims, 6 Drawing Sheets

(56) References Cited

U.S. PATENT DOCUMENTS

| | | | |
|---|---|---|---|
| 2011/0108742 A1* | 5/2011 | Weaver | H01L 21/67739 250/492.21 |
| 2011/0245957 A1* | 10/2011 | Porthouse | H01L 21/67236 700/114 |
| 2011/0286818 A1* | 11/2011 | Kim | H01L 21/67742 414/222.01 |
| 2012/0143366 A1 | 6/2012 | Machida | |
| 2012/0325148 A1 | 12/2012 | Yamagishi et al. | |
| 2013/0108406 A1* | 5/2013 | Schaller | H01L 21/67213 414/744.3 |
| 2013/0209198 A1* | 8/2013 | Forderhase | H01L 21/67046 414/222.01 |
| 2014/0265392 A1* | 9/2014 | Pergande | B25J 11/0095 294/81.5 |
| 2014/0265393 A1* | 9/2014 | Pergande | H01L 21/67742 294/81.5 |
| 2014/0265394 A1* | 9/2014 | Pergande | B25J 15/0014 294/81.5 |
| 2017/0173799 A1* | 6/2017 | LoPiccolo | H01L 21/68785 |

* cited by examiner

SUBSTRATE PROCESSING SYSTEM, SUBSTRATE CONVEYING DEVICE AND CONVEYING METHOD

RELATED APPLICATION DATA

This application claims priority to, and the benefit of, Chinese Patent Application No. 201710193126.9, filed on Mar. 28, 2017, pending. The entire disclosure of the above application is expressly incorporated by reference herein.

FIELD

This disclosure relates to the technical field of substrate processing, in particular to a substrate conveying device and a substrate conveying method, and a substrate processing system comprising the substrate conveying system.

BACKGROUND

Existing substrate conveying device for conveying multiple substrates and existing substrate batch processing system such as equipment used for depositing thin films onto substrates typically require a substrate support plate to convey the substrates.

The method of conveying substrates using a substrate support plate has the following deficiency:

1. in the processing of substrates such as in the deposition of a thin film onto a substrate, deposition can also be formed on the substrate support plate, in order to prevent the deposition on the substrate support plate from falling off and forming defects on the substrate surfaces, the substrate support plate must be periodically cleaned after the deposition on the substrate support plate has accumulated a certain thickness of deposition such as from 0.5 to 1 micron 2. in order to reduce the process reaction time in the process reaction chamber and improve the productivity of the whole system, before the substrate support plate is conveyed to the process reaction chamber, the substrate support plate needs to be preheated in the substrate loading chamber so that the substrate support plate is close to the substrate processing temperature.

3. in order to reduce the possibility of the deposited thin film from cracking, after the substrate is processed, the substrate support plate must be cooled before the substrate support plate is exposed to the atmosphere.

In addition, for substrates which require front and back side deposition of thin films, such as Silicon wafers used for Heterojunction solar batteries, in order to avoid cross contamination, the substrate support plate used for front side deposition is required to be separated from the substrate support plate used for back side deposition, in this manner, for a substrate where a thin film needs to be deposited on the front and back surfaces, after one-sided thin film deposition is completed, the substrate is required to be transferred from one substrate support plate to another substrate support plate.

SUMMARY

In order to avoid the use of a substrate support plate during substrate conveying and substrate processing, an improved substrate conveying device and method are described herein.

A substrate processing system containing the substrate conveying device is also described herein.

In order to solve the technical problems described above, one or more embodiments described herein adopts the following technical scheme:

The substrate conveying device comprises a plurality of rows of substrates such as silicon wafers arranged in rows, wherein each row of wafers comprises a plurality of wafers; the substrate conveying device comprises:

The conveying mechanical arm: such conveying mechanical arm is provided with a substrate conveying fork, the substrate conveying fork comprises a main body and a plurality of mutually parallel branches, one end of each branch is connected to the main body, and the other end of each branch is a free end;

A plurality of grooves are formed in each of the branches, a plurality of grooves in every adjacent branches are oppositely arranged.

Every groove in each branch and the groove opposite on the adjacent branch form a wafer supporting structure. Optionally, the side wall of the groove is a slope.

A substrate processing system comprises a plurality of rows of wafers arranged in rows, wherein each row of wafers comprises a plurality of wafers, the substrate processing system comprises: a loading chamber used for loading the substrate, and a conveying chamber used for conveying the substrate, a process reaction chamber used for carrying out process reaction treatment on the substrate, and the unloading chamber used for unloading the substrate.

The conveying chamber is respectively connected with the loading chamber, the process reaction chamber and the unloading chamber with an isolating valve arranged in between the chambers The substrate conveying chamber has at least one set of substrate conveying device as described in claim 1 or 2 above, The loading chamber and the unloading chamber are respectively provided with substrate bearing column for supporting each wafer A pedestal to support substrates is arranged in the process reaction chamber; on the pedestal is arranged a plurality of substrate bearing columns, the columns correspond to the substrates on the pedestal to be borne, and the surface of the substrate support column is smaller than the surface of the substrate; each support column can lift the substrate from the surface of the pedestal.

Optionally, the substrate processing chamber is arranged with substrate support columns on the pedestal such that the support columns can move up and down and provide lifting motions on the substrate away and towards the surface of the pedestal.

Optionally, the substrate process reaction chamber has arranged a substrate conveying fork positioning device which is used for positioning the free ends of the branches of the substrate conveying fork, so that the substrates on the conveying fork and the corresponding substrate support columns on the pedestal are aligned in the up and down direction.

Optionally, the substrate loading chamber and the substrate unloading chamber can be stacked on top of each other.

Optionally, a substrate bearing column arranged in the loading chamber can be used for heating the substrate borne by the substrate support column, and/or a pedestal arranged in the process reaction chamber can be used for heating the substrates borne by the pedestal.

Optionally, a substrate support column arranged in the unloading chamber can be used for cooling the substrate borne by the substrate support column;

Optionally, the substrate conveying chamber has arranged two sets of substrate conveying devices wherein one set of substrate conveying device is used for conveying substrates to the process reaction chamber, and the other substrate conveying device is used for removing substrates from the process reaction chamber Optionally, the system further comprises a substrate loading device arranged at the front end of the substrate loading chamber, wherein the substrate loading device and the substrate conveying device are similar in structure Optionally, the system further comprises a substrate unloading device arranged at the rear end of the substrate unloading chamber, wherein the substrate unloading device and the substrate conveying device are similar in structure;

Optionally, the internal shape of the process reaction chamber is circular.

The substrate conveying method is characterized, the method is applied to the substrate processing system according to any one of the above embodiments; the method is based on the substrate conveying device according to any one of the above embodiments; the method comprises the following steps:

in an initial chamber, opposing grooves in adjacent branches of a substrate conveying fork supports the edge regions of the lower surface of a substrate;

a substrate conveying mechanical arm transfers a substrate conveying fork supporting a plurality of substrates to a target chamber;

The substrate conveying mechanical arm lowers the substrates on the substrate transfer fork onto respective substrate bearing columns placed in the target chamber, and then the substrate conveying fork is moved out below the substrate.

Optionally, a substrate conveying fork positioning device is arranged in the target chamber.

Before the substrate conveying mechanical arm lowers each substrate on the substrate conveying fork onto the corresponding substrate bearing columns in the target chamber, the substrate conveying fork positioning device in the target chamber may be used for positioning the free ends of the branches on the substrate conveying fork, so that each substrate is aligned with the corresponding substrate support column below.

Comparing with prior arts, one or more embodiments described herein has the following advantages:

From the above description, the substrate conveying device provides a substrate support structure on the conveying fork when two opposing grooves in adjacent branches of the conveying fork form a secure pocket for the substrate in the process of conveying between chambers in the substrate processing system. Meanwhile, the substrate conveying device and the substrate supporting structure in each chamber are respectively matched, for example, in the loading and unloading chambers, a set of substrate bearing columns are aligned with the substrates arrangement on the conveying fork. Another example is the process reaction chamber having a substrate support pedestal with substrate bearing columns matching the arrangement of substrates on the conveying fork. Therefore, the method in accordance with some embodiments can be utilized to convey substrates to all chambers in the substrate processing system without requiring a substrate support plate during the substrate conveying process.

In addition, in some embodiments, based on a pedestal and substrate bearing columns arranged in the process reaction chamber, substrates can be directly placed onto a heated pedestal of the process reaction chamber, so that the substrates can be directly heated by the pedestal. Due to the low mass of the substrates, they can be heated to the processing temperature within a relatively short time. In this way, the substrate processing efficiency of the system can be improved.

In addition, in the process reaction chamber, the substrate can be placed directly onto the pedestal for processing. Therefore the substrate bearing plate is not needed and the trouble of periodically cleaning the substrate bearing plate can be avoided. In addition, for substrates needed to be processed on the front surface and on the back surface, the elimination of the substrate bearing plate eliminates the cross contamination which can be transmitted by the substrate bearing plate. Therefore, the substrate conveying system based on the substrate conveying device, the substrate conveying method and the substrate processing system can reduce the cross contamination of the substrate and improve the yield of the substrate.

In addition, after the substrate is processed, and the substrate is conveyed to the substrate unloading chamber, the substrate can be directly cooled. Since the mass of the substrate is small, the time to cool the substrate can be reduced and therefore the processing flow of the substrate can be accelerated.

A conveying device for conveying at least a first row of substrates and a second row of substrates, includes: a conveying fork having a main body and a plurality of branches, a first end of each of the branches is connected to the main body, and a second end of each of the branches is a free end; wherein a first branch of the plurality branches has a first plurality of grooves, and a second branch of the plurality of branches has a second plurality of grooves; and wherein one of the first plurality of grooves and one of the second plurality of grooves are configured to support one of the substrates in the first row.

Optionally, a side wall of one of the first plurality of grooves is sloped.

Optionally, the conveying device further includes a mechanical arm coupled to the conveying fork.

Optionally, the mechanical arm is configured to move the first row of substrates and the second row of substrates vertically, horizontally, or both vertically and horizontally.

Optionally, the first branch and the second branch are parallel with respect to each other.

Optionally, the first plurality of grooves at the first branch, and the second plurality of grooves at the second branch, are configured to support respective ones of the substrates in the first row.

Optionally, a third branch of the plurality of branches has a third plurality of grooves, which are configured to support respective ones of the substrates in the second row.

Optionally, the conveying device is configured to convey the first and second rows of substrates to a process reaction chamber, and/or to remove the first and second rows of substrates from the process reaction chamber.

A processing system includes the conveying device, wherein the conveying device is located in a conveying chamber; a loading chamber for loading the first and second rows of substrates; and a process reaction chamber for carrying out process reaction treatment for the first and second rows of substrates.

Optionally, the processing system further includes an unloading chamber for unloading the first and second rows of substrates.

Optionally, the loading chamber and the unloading chamber are stacked in an up-and-down arrangement.

Optionally, the processing system further includes a first isolating valve between the conveying chamber and the loading chamber, and a second isolating valve between the conveying chamber and the process reaction chamber.

Optionally, an inner shape of the process reaction chamber is circular.

Optionally, the process reaction chamber comprises pedestals configured to support respectively the substrates in the first and second rows.

Optionally, the processing system further includes columns configured to support respectively the substrates in the first and second rows, and wherein a cross sectional area of one of the columns is smaller than a surface area of a respective one of the substrates in the first and second rows.

Optionally, the columns are configured to move up to place the substrates in the first and second rows away from the pedestals and/or to move down to place the substrates in the first and second rows towards the pedestals.

Optionally, the columns and/or the pedestals are configured provide substrate heating.

Optionally, the processing system further includes a positioning device configured to move the conveying fork to vertically align the substrates in the first and second rows with respective supporting structures.

Optionally, the supporting structures are configured to provide substrate cooling.

Optionally, the processing system further includes a loading device arranged at a front end of the loading chamber, wherein the loading device comprises: an additional conveying fork having a main body and a plurality of branches, a first end of each of the branches in the additional conveying fork is connected to the main body of the additional conveying fork, and a second end of each of the branches in the additional conveying fork is a free end; wherein a first branch of the plurality branches in the additional conveying fork has a first plurality of grooves, and a second branch of the plurality of branches in the additional conveying fork has a second plurality of grooves; and wherein one of the first plurality of grooves associated with the additional conveying fork and one of the second plurality of grooves associated with the additional conveying fork are configured to support one of the substrates in the first row.

Optionally, the processing system further includes an unloading chamber, and an unloading device arranged at a rear end of the unloading chamber, wherein the unloading device comprises: an additional conveying fork having a main body and a plurality of branches, a first end of each of the branches in the additional conveying fork is connected to the main body of the additional conveying fork, and a second end of each of the branches in the additional conveying fork is a free end; wherein a first branch of the plurality branches in the additional conveying fork has a first plurality of grooves, and a second branch of the plurality of branches in the additional conveying fork has a second plurality of grooves; and wherein one of the first plurality of grooves associated with the additional conveying fork and one of the second plurality of grooves associated with the additional conveying fork are configured to support one of the substrates in the first row.

Optionally, the processing system further includes an additional conveying device in the conveying chamber, wherein the conveying device is configured for conveying the substrates in the first and second rows to the process reaction chamber, and the additional conveying device is configured to remove the substrates in the first and second rows from the process reaction chamber.

Optionally, the conveying fork is configured to obviate a need to use substrate supporting tray.

A conveying method includes: providing a conveying fork having a main body and a plurality of branches, a first end of each of the branches is connected to the main body, and a second end of each of the branches is a free end, wherein a first branch of the plurality branches has a first plurality of grooves, and a second branch of the plurality of branches has a second plurality of grooves; supporting a plurality of substrates by the branches of the conveying fork; and lowering the conveying fork to place the substrates onto respective supporting structures.

Optionally, the supporting structures are in a chamber, and wherein the conveying method further comprises positioning free ends of the branches to align the substrates with the respective supporting structures.

In conclusion, based on the utilization of the substrate conveying device and the substrate processing method described herein, one can achieve the conveying and processing of substrate without the need of a substrate bearing plate. Therefore, the deficiencies of the prior art which utilizes a substrate bearing plate to convey and process substrates can be overcome. Also, the substrate conveying device, and the substrate processing system in accordance with some embodiments can simplify the substrate processing procedure and improve the efficiency of processing the substrate.

DESCRIPTION OF THE FIGURES

In order to more clearly illustrate the technical scheme in the embodiments of the present application or in the prior art, the accompanying drawings and figures below are used in the description of the embodiments or the prior art.

LABELS FOR THE ATTACHED FIGURES

11: Atmospheric loading robot for substrates,
12: Substrate loading arm (or mechanism)
13: Substrate loading chamber
14: Substrate conveying chamber
15: Process reaction chamber
16: Substrate unloading chamber
17: Substrate unloading mechanism
18: Atmospheric unloading robot for substrates
19: isolation valves.
21: main structure of the substrate conveying fork
22: branches of the fork supporting the substrates
50: buffer chamber

DETAILED DESCRIPTION

In order for a person skilled in the art to better understand the scheme of the embodiments, the following description will refer to the accompanying figures to better describe the embodiments of the present application. It should be noted that the described embodiments are only part of the embodiments of the present disclosure, rather than all of the embodiments. The embodiments of the present disclosure, and all the other embodiments obtained by persons of ordinary skills in the art without creative efforts, shall belong to the scope of protection of the claimed invention.

It should be noted that the substrate described in some embodiments comprises a plurality of wafers arranged in rows and columns.

Figure 1:
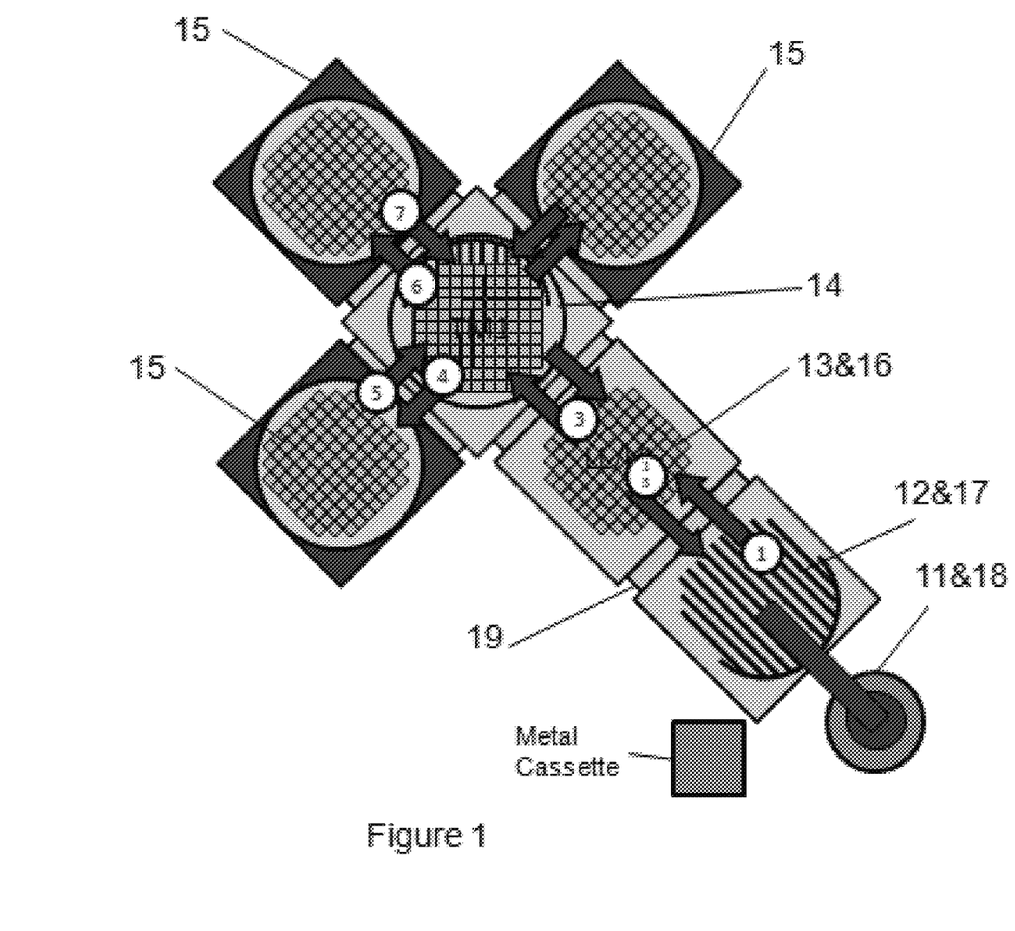
FIG. 1 illustrates the framework of the substrate processing system in accordance with some embodiments.

FIG. 1 illustrates the framework of the substrate processing system in accordance with some embodiments. According to FIG. 1, the substrate processing system includes:

Atmospheric loading robot 11, the substrate conveying mechanism 12, the substrate loading chamber 13, the substrate conveying chamber 14, the substrate processing chamber 15, the substrate unloading chamber 16 and the substrate unloading mechanism 17 and the substrate unloading robot 18

In particular, the substrate conveying chamber 14 is connected to the loading chamber 13, and the process reaction chamber 15 and the unloading chamber 16 via an isolation valve 19 in between each of the respective chambers.

The substrate conveying chamber 14 described above has at least one set of substrate conveying mechanism The loading chamber 13 and the unloading chamber 16 are respectively provided with substrate supporting columns used for supporting the substrates; Each substrate requires one or multiple supporting columns acting as a group (hereafter refer to as a substrate supporting column) to support a substrate so the number of substrate supporting column in the loading chamber 13 and the unloading chamber 16 correspond to the number of substrates which will be placed on the substrate supporting platform in the loading chamber 13 and the unloading chamber 16.

The substrate loading device 12 disposed at the front end of the loading chamber 13 is comprised of a substrate loading robot 11 which will pick up substrates from incoming substrate metal containers and place them onto the substrate loading device 12 and conveyed into the loading chamber 13. More specifically, substrates will be loaded onto the substrate supporting columns in loading chamber 13

Figure 2:
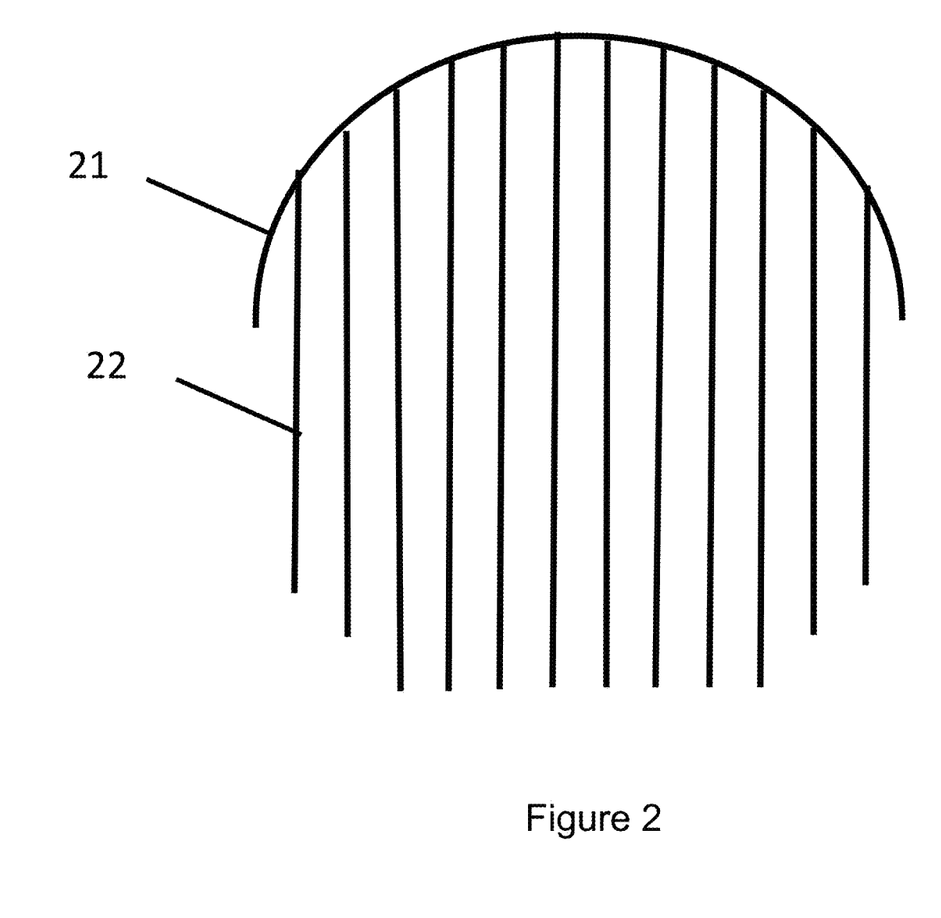
FIG. 2 illustrates the structure of the substrate conveying fork in accordance with some embodiments.

The substrate unloading device 17 is arranged at the tail end of the unloading chamber 16, and is used for removing substrates from the substrate supporting columns in the unloading chamber 16 and conveying the substrates using the substrate unloading robot 18, into the wafer containing metal boxes The following describes the interior structure of the substrate conveying chamber 14:

In some embodiments, at least one set of substrate conveying device is comprised in the substrate conveying chamber 14. The substrate conveying device can directly convey substrates without the need of a substrate bearing plate, in particular, the substrate conveying device comprises of a substrate conveying mechanical arm, a main support structure 21 connected to a plurality of substrate supporting branches 22 arranged in parallel and attached at one end to the main structure 21 and having the other end being a free end as shown in FIG. 2. In general, the substrates are either multi-sided or circular in shape, and the main structure of the substrate conveying device can be semicircular Each branch 22 of the fork has a plurality of grooves (not shown on FIG. 2) and the grooves in each branch correspond to the grooves in the adjacent branch in the opposite direction Each groove on each of the branch 22 on the substrate conveying fork corresponds to the groove on the opposite end of the adjacent branch and form a pocket to support a substrate. In this manner, the substrate is supported on two opposite sides, leaving the center area for the substrate supporting column to support the substrate during the transfer of the substrate onto and unto the substrate conveying fork Supported by opposite grooves on the adjacent branches of substrate conveying fork, substrates are secured on the substrate conveying device during the conveying process. In addition, the side walls of the grooves on the branch 22 can be sloped to enhance the centering of the substrates in the pocket area of the substrate conveying fork.

Figure 3:
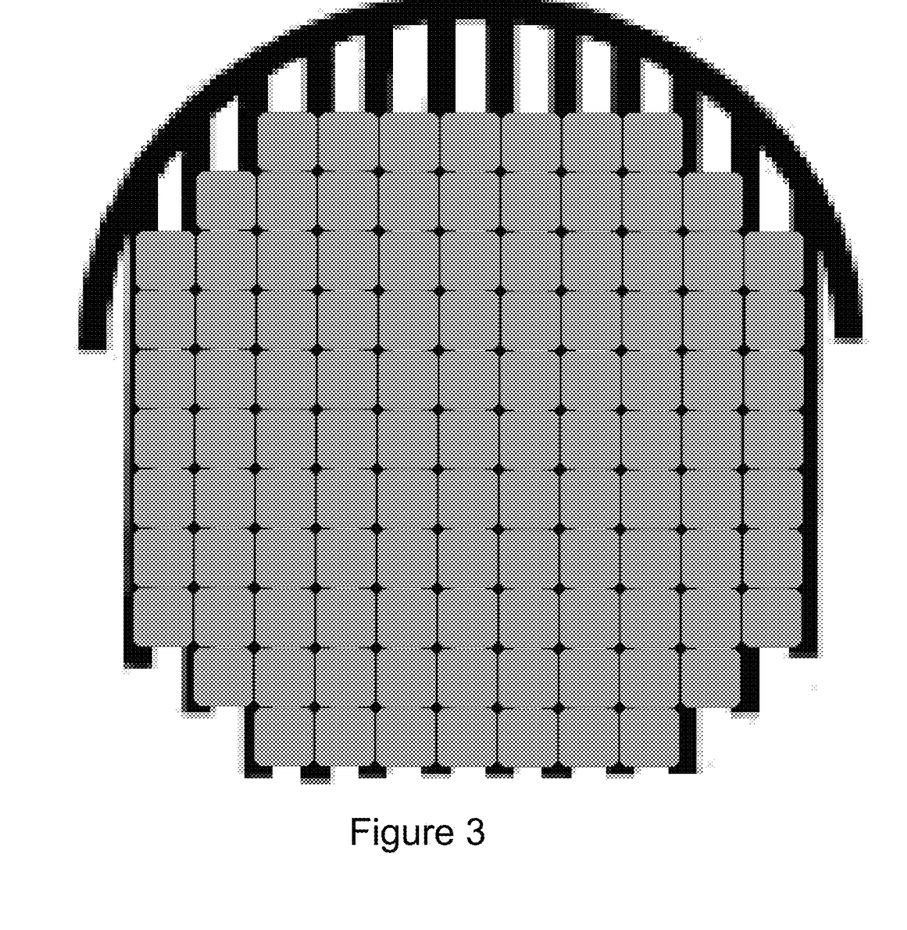
FIG. 3 illustrates the substrate conveying fork with substrates supported by the conveying fork in accordance with some embodiments.

To illustrate, FIG. 3 shows an example of a layout of substrates on the substrate conveying fork. Each of the square objects in the diagram represents a square substrate.

It should be noted that, in the embodiment of the present application, the mechanical arm on the substrate conveying device can extend, retract and moves up and down so that the substrate conveying device can be conveniently conveyed to a target position. In the embodiment of the present application, the substrate conveying device in the conveying chamber 14, the substrate can be conveyed from the loading chamber 12 to the process reaction chamber 15 for processing. The substrate conveying device can further convey the processed substrate from the process reaction chamber 15 to the unloading chamber 16

Furthermore, in order to facilitate the removal of the substrate from the substrate conveying fork, the side walls of the grooves on the branch are sloped, when the substrate needs to be removed from the conveying fork, the substrate can go through the conveying fork through the slope of the groove (expanding groove), and therefore be easily taken out from the fork. Once the substrate is loaded into the grooves of the conveying fork, the substrate is trapped by the tightening slope surfaces of the groove and therefore be held securely during the conveying process.

It should be noted that in the embodiment of the present application, since the typical substrate used in solar cell processing are four sided and the corners are of a circular shape, the pocket for conveying the wafer formed by the opposite grooves on the adjacent branch of the conveying fork can be seen as a square shape groove. In addition, such a square shaped pocket has circular corners. The sides of the substrates are trapped within the structure of such square shape pocket.

In the embodiment of the present application, the substrate conveying device in the conveying chamber 14 can convey substrates from the loading chamber 13 to the process reaction chamber 15, and the processed substrates can be transferred from the process reaction chamber 15 to the unloading chamber 16.

In order to improve the efficiency of a substrate processing system, two sets of substrate conveying devices can be arranged in the substrate conveying chamber 14; one set of the substrate conveying devices can be used for conveying substrates from the loading chamber 13 to the process reaction chamber 15, and the other set of substrate conveying devices is used for taking away the processed substrates from the process reaction chamber 15 and conveying them to the unloading chamber 16. Therefore, the two sets of substrate conveying devices can be used for conveying substrates out of and into the process reaction chamber 15 sequentially, such that the opening time of the isolating valve on the process reaction chamber 15 can be shortened which means the non-processing time in the process reaction chamber 15 is minimized.

In addition, in order to increase the efficiency of the substrate processing system, the opening time of the isolation valve of the loading chamber 13 needs to be reduced, wherein the substrate loading device is arranged at the front end of the loading chamber 13, while one set of substrate loading device is conveying substrates into the loading chamber 13, another substrate loading device can be positioned in front of the substrate loading robot 11 and allowing substrates to be loaded onto the second substrate loading device. When the loading chamber 13 isolation valve opens again, the second set of substrate loading device can now be inserted into the loading chamber 13. At this time, the first wafer conveying device is moved to the substrate loading robot 11 to load more substrates and repeat the process.

Based on the same principle, the substrate unloading device 17 arranged at the tail end of the unloading chamber 16 can also comprised of two sets, wherein, when the substrates placed on the substrate unloading device is taken from the unloading chamber and being picked to return to the substrate container box by substrate unloading robot 18, the other empty substrate unloading device can be inserted into the unloading chamber to extract processed substrates from the unloading chamber. In this manner, the opening time of the isolation valve of the unloading chamber can be kept to a minimum and the overall efficiency of the processing capability of the entire system can be elevated.

In order to load the substrate onto the substrate conveying device and to remove the substrate from the substrate conveying device, wherein a pedestal is used for bearing the substrates in the process reaction chamber 15 of the substrate processing system; a plurality of lifting columns are arranged on the pedestal, and corresponds to the arrangement of the substrates to be borne on the pedestal; the surface of the lifting column is smaller than the surface of the substrate such that the edges are exposed and the substrate can be picked up from the lifting column using the pockets formed on the branches of the substrate conveying fork. The arrangement of the lifting columns on the pedestal are matched with the arrangement of the substrate on the pedestal, in particular, the lifting columns can be arranged on the pedestal in a row, and each row of lifting columns comprises a plurality of lifting columns.

The substrate lifting columns on the pedestal of processing chamber 15 can be moved upwards or downwards, the movement of the lifting columns will bring forth the up and down movement of the substrate supported by the lifting column. As an example, the lifting column can protrude the upper and lower surfaces of the substrate supporting pedestal in the process reaction chamber.

In some embodiments, the process reaction chamber 15 can comprise of an alignment device for the substrate conveying fork, each free end of the substrate conveying fork can be aligned by the features of this alignment device so that each substrate on the substrate conveying fork can align to the lifting column on the pedestal of the process reaction chamber 15. More specifically, the purpose of the substrate conveying fork alignment device is to provide alignment of every wafer on the substrate conveying fork to each of the corresponding lifting column on the pedestal below in the processing chamber.

In addition, the pedestal in the process reaction chamber can be used to add heat energy to the substrates placed on the pedestal to allow the substrates to reach the necessary processing temperature. In this embodiment, the substrates are placed directly onto the pedestal for heating, due to the low mass of the substrates, the substrates can achieve processing temperature in a relatively short time when compared with substrates being supported on a substrate support tray which has additional mass and require significantly longer heat up time.

In addition, when the application is for a PECVD processing system, the pedestal in the processing chamber is a lower electrode of a parallel plate plasma process reaction chamber. While RF power or direct current power is applied to the upper and lower electrodes of this process reaction chamber, the process reaction chamber will have plasma reaction and radicals are generated.

In addition, the current prior art utilizes a substrate support tray to transport the substrates onto the space between the upper and lower electrode. Since this tray has substantial mass, size and thickness, it will interrupt the plasma between the two electrodes and may lead to uneven distribution of plasma. In this embodiment, substrates are placed directly onto the lower electrode and eliminated the uncertainty due to a large objects forming in between the electrodes, the electrical field properties are not altered significantly and therefore more repeatable process performance can be obtained.

As an alternative embodiment of the present application, in order to reduce the process reaction time of the substrate in the processing chamber 15, a substrate support column arranged in the loading chamber 13 can be used for heating a substrate placed on the substrate support column, so that the temperature of the heated substrate is close to the processing temperature of the substrate. As another alternative embodiment of the present application, the substrate support columns arranged in the unloading chamber 16 can be used for cooling of the substrate supported by the substrate support column;

As a specific embodiment of the present application, the substrate loading device 12 as described above and the structure of the substrate unloading device 17 can be the same structure as the substrate conveying device. Therefore, the substrate support tray is not needed when substrates are loaded and unloaded. In addition, in order to load and unload the substrates in the substrate loading device 12 and the substrate unloading device 17, the loading chamber 13 and the unloading chamber 16 are respectively provided with substrate bearing columns used for supporting the substrates. The substrate bearing columns are beneficial to the substrate loading device 12, the substrate conveying device in the substrate conveying chamber 14, and the loading and unloading of substrates in the loading chamber and unloading chamber.

As a specific embodiment of the application, the internal shape of the substrate process reaction chamber 14 can be circular, so that gas flow uniformity and plasma uniformity can be enhanced.

In order to reduce the footprint of the substrate processing system by reducing its physical dimensions, in another embodiment, the loading chamber 13 and the unloading chamber 16 can be stacked on top of each other. In order to further reduce the volume of the substrate processing system, the position of the loading station 12 and the position of the unloading station 17 are set at 90 degrees to each other (see FIG. 5)

In some embodiments, the loading chamber 13 and unloading chamber 16 can also be placed horizontally in the same plane as each other.

Also, in some embodiments, in order to preheat the substrate and when the substrate support column inside loading chamber 13 cannot be used to provide preheat function to the substrate, an external preheat chamber (not shown) can be arranged in front of the loading chamber 13 and connected to the loading chamber 13. Such preheat chamber is isolated from loading chamber 13 by an isolation valve. The preheat chamber has a heated pedestal on which are substrate supporting columns which correspond to the position of the substrates going into the loading chamber 13. The substrate support columns are smaller than the substrate itself and each support column can lift the corresponding substrate on top of it to a position above the heated pedestal.

In addition, to provide cooling function to the substrate when the substrate support columns in the loading chamber 16 are unable to provide effective cooling to the substrate, an additional cooling station can be arranged outside of the unloading chamber 16 and connected to the unloading chamber 16. The cooling station and the unloading station are isolated by an isolation valve.

The above mentioned cooling station has a substrate supporting cooling pedestal which has several substrate supporting columns corresponding to the substrates on the substrate conveying device. The size of the substrate supporting column is smaller than the substrate and each column can lift up the substrate corresponding on top of it to a position above the pedestal.

When the substrate processing system provided by the embodiment is used for processing the substrate, the whole process of the substrate processing system in accordance with some embodiments is described as follows:

It should be noted that in the substrate processing system shown in FIG. 1, the arrows indicate the direction of the substrate processing steps. The substrate loading robot 11 conveys the substrate to the substrate loading device 12, and then, the substrate loading device 12 is used for conveying the substrate to a position directly above the substrate support column of the loading chamber 13, and each substrate is aligned with the corresponding substrate support column before lowering the substrates onto the substrate support column, then the substrate loading device 12 is moved out of the loading chamber 13, and the isolation valve at the front end of the loading chamber 13 is closed When the isolation valves between the loading chamber 13 and the conveying chamber 14 and between the conveying chamber 14 and the process reaction chamber 15 are opened, the substrate conveying device arranged in the conveying chamber 14 will convey the substrate from the substrate support column of the loading chamber 13 to the branches on the substrate conveying device. A substrate bearing structure formed by the grooves in the adjacent branches of the substrate conveying device is used for picking up and securing the substrate on the substrate conveying device and conveying the substrate to the substrate supporting columns arranged in the process reaction chamber 15. In a specific embodiment where there is a preheat function in the system, the substrate is preheated first and then conveyed to the loading chamber, after that, it is conveyed from the loading chamber 13 to the substrate process reaction chamber 15 using the substrate conveying device in the conveying chamber 14.

When the isolation valves between the loading chamber 13 and the conveying chamber 14 and between the conveying chamber 14 and the process reaction chamber 15 are closed, the substrate is processed in the process reaction chamber 15. After the substrate is processed in the process reaction chamber 15, the isolation valves between the conveying chamber 14 and the process reaction chamber 15 and between the process reaction chamber 15 and the unloading chamber 16 are opened, the substrate conveying device in the conveying chamber 14 will be used to pick up the substrate from the substrate supporting column of the process reaction chamber 15, and conveyed to the substrate supporting column of the unloading chamber 16. In addition, when there is a cooling function in the system, the substrate is first transferred from the process reaction chamber 15 to the unloading chamber 16 and then transferred to the cooling station (not shown).

It should be noted that in the substrate processing system in accordance with some embodiments, the loading chamber 13 and unloading chamber 16 can be both at above or below atmospheric pressure environment while the process reaction chamber 15 and the conveying chamber 14 are in the sub atmospheric pressure environment.

In addition, in the field of substrate processing, a substrate may require multiple processing steps, such as depositing multilayer of thin films on the surface of the substrate, in order to prevent cross contamination, each processing step may require an independent process reaction chamber. In order to meet such requirement, in some embodiments, the processing system can comprise of a plurality of process reaction chambers and a plurality of conveying chambers; the structure corresponding to such a substrate processing system is shown in FIG. 4

Figure 4:
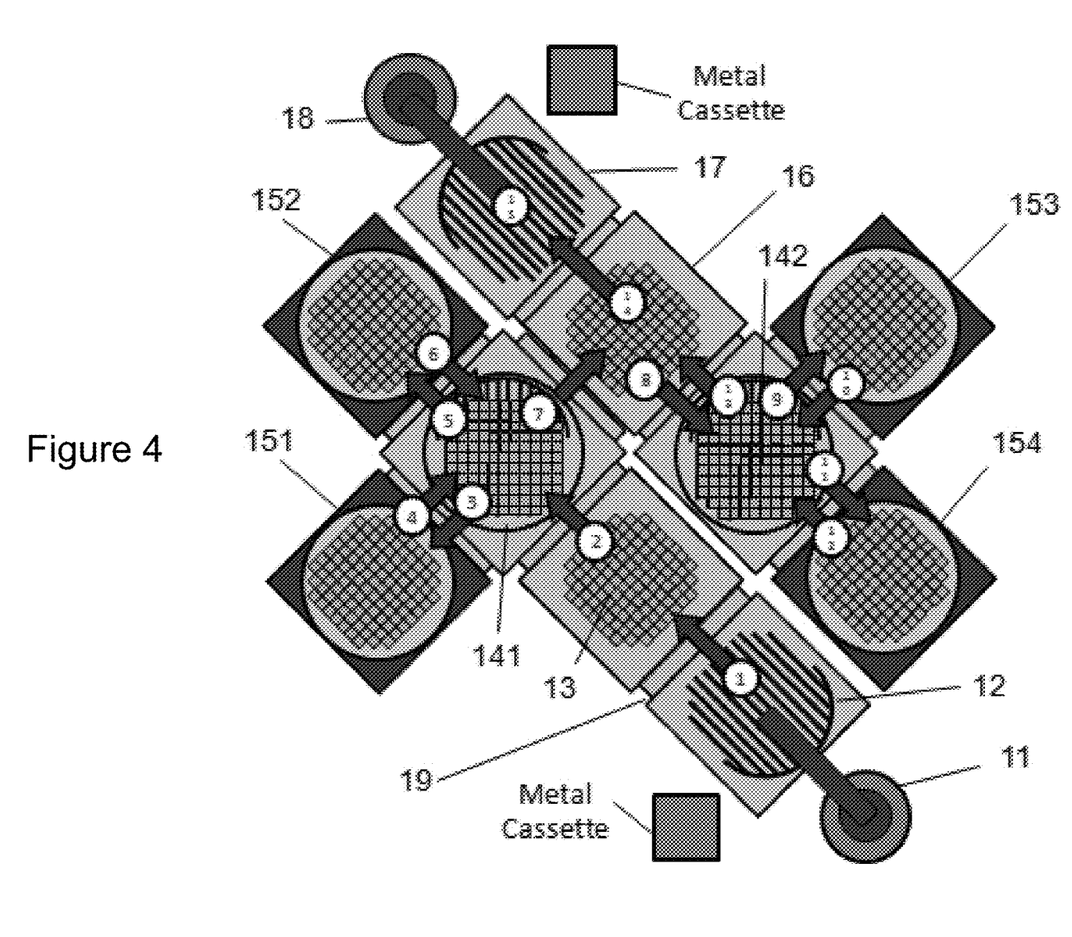
FIG. 4 illustrates a diagram of an alternate structure of the substrate processing system in accordance with some embodiments.

As an example, the substrate processing system structure shown in FIG. 4 is basically the same as the substrate processing system shown in FIG. 1 the differences are characterized as follow: the substrate processing system shown in FIG. 4 comprises of two conveying chambers: a first conveying chamber 141, a second conveying chamber 142 and four process reaction chambers: from the first process reaction chamber 151 to the fourth process reaction chamber 154. The first conveying chamber 141 is connected to the first process reaction chamber 151 and the second process reaction chamber 152, and connected to each of the process reaction chamber with a corresponding isolating valve. The second conveying chamber 142 is connected to the third process reaction chamber 153 and to the fourth process reaction chamber 154 and connected to each of the process reaction chambers with a corresponding isolating valve. Therefore the first conveying chamber 141 is used for conveying substrates between the loading chamber 13, the first process reaction chamber 151 and the second process reaction chamber 152, and the unloading chamber 16. The second conveying chamber 142 is used for conveying substrates between the loading and unloading chamber 16, the third process reaction chamber 153 and the fourth process reaction chamber 154. In this structure, chamber 16 can be both a buffer chamber (from first processing steps) and an unloading chamber (for substrates completing both first processing sequence and second processing sequence).

It should be noted that the substrate processing system shown in FIG. 4 can be regarded as a double-cluster system. In such double-cluster system, the first process reaction chamber 151, the second process reaction chamber 152, the third process reaction chamber 153 and the fourth process reaction chamber 154 can perform different treatment on the substrate, such as depositing films with different thicknesses and/or different types of film. In a specific embodiment, the first process reaction chamber 151 and the second process reaction chamber 152 can process the same surface of the substrate, the third process reaction chamber 153 and the fourth process reaction chamber 154 can process the other surface of the substrate. It should be noted that in the substrate processing system shown in FIG. 4, according to the pre-arranged substrate processing mode, the substrate can be treated in the first process reaction chamber 151 and the second process reaction chamber 152 by adopting the same process treatment condition, and the substrate can also be treated by adopting different process treatment conditions. Also, in the third process reaction chamber 153 and the fourth process reaction chamber 154, the substrate can be processed by adopting the same process treatment condition and can also be used for adopting a different process treatment conditions.

Figure 5:
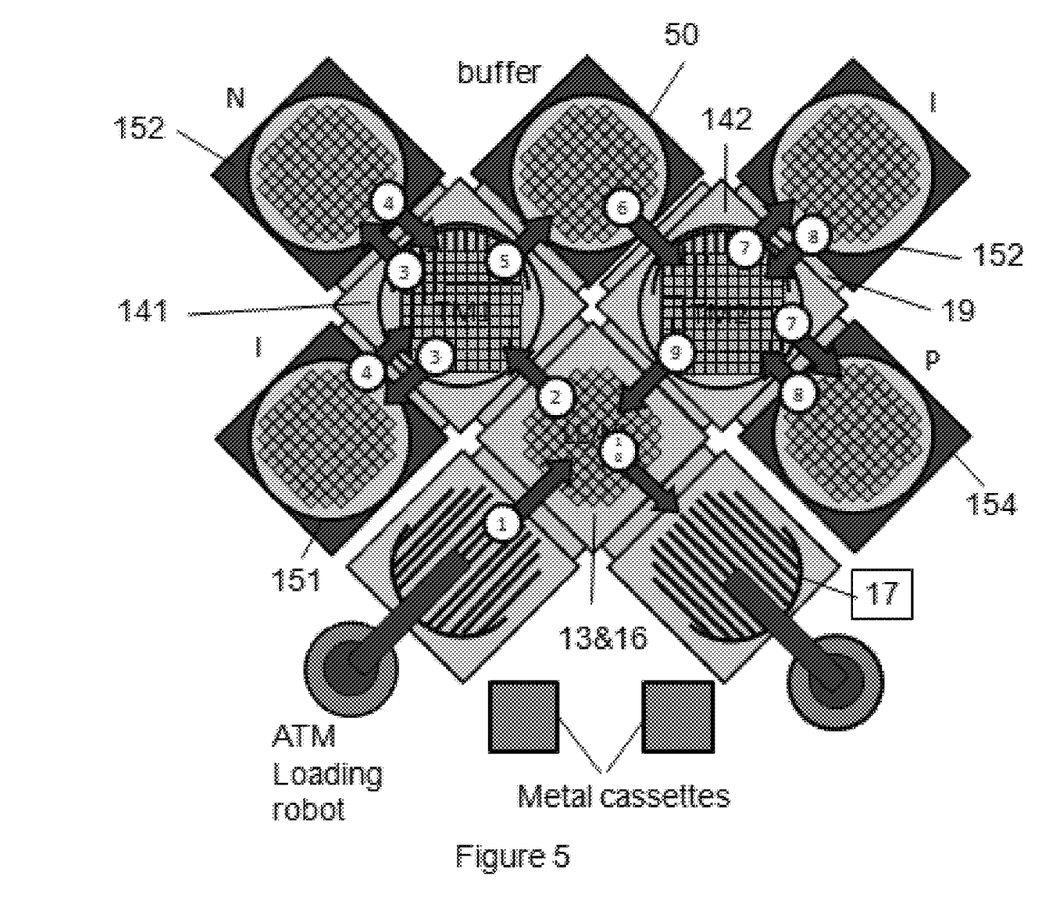
FIG. 5 illustrates a diagram of an alternate structure of the substrate processing system in accordance with some embodiments.

Since the time required by different processes are different, and if one substrate is processed from the previous process reaction chamber according to the processing sequence, and the next process reaction chamber for subsequent processing is not ready to receive it, the processing efficiency will be decreased as a result of such waiting. In order to avoid the situation, as shown in FIG. 5, a buffer chamber 50 is included in the substrate processing system where as buffer chamber 50 is communicated with the first conveying chamber 141 and the second conveying chamber 142, with isolating valves respectively arranged between the buffering chamber 50 and the first conveying chamber 141 and the second conveying chamber 142. In this way, the first conveying chamber 141 and the second conveying chamber 142 can divide the substrates from the first process reaction chamber 151 to the fourth process reaction chamber 154 using the buffer chamber 50 to collect and protect the substrate in between processes.

The buffer chamber 50 comprise of a substrate bearing structure for supporting each substrate. The supporting structure can be similar to the substrate supporting column in chamber 13 or similar to the pedestal and substrate lifting device in process reaction chamber 15.

In some embodiments, when the substrate is treated in a system as shown in FIG. 4 or FIG. 5 in which the system is applied to the deposition of the heterojunction solar cell structure, the process reaction chambers 151, 152, 153 and 154 can be respectively used for generating the doped and undoped layers of the photovoltaic device. The layers of the doped layer, for example, a p-type doping (such as Boron-doped silicon layer), an undoped layer i-type (such as intrinsic silicon layer) and a n-type doping (such as Phosphorus-doped silicon layer) can be deposited in the above mentioned process reaction chambers.

It should be noted that in the embodiments of the present application, each chamber in the substrate processing system can be arranged in an annular manner to form a cluster system and can also be arranged in a linear manner to form a linear array substrate processing system. The cluster system structure is sometimes beneficial in the reduction of the occupied area.

As an example, the substrate processing system in accordance with some embodiments can be a PECVD (Plasma Enhancement Chemical Vapor Deposition) processing equipment system When the substrate processing system is a PECVD processing system, there are two opposing electrodes arranged in the process reaction chamber 15. The substrates are typically placed on the lower electrode or the pedestal which are typically heated to reach the thin film deposition temperature. In solar cell processing application, the film deposition temperature is generally between 180 degree Celsius and 250 degree Celsius. The reaction gases and the inert gases are sprayed out from the shower head in the upper electrode and are dispersed onto the surface of the substrates. In the process reaction chamber 15, a plasma is generated between the pedestal and the shower head by utilizing radio frequency generator as a source of energy. In such manner, one or more layers of thin film material are deposited onto the surface of the substrates.

Based on the substrate processing system described herein, a specific implementation of the substrate conveying method is further provided in accordance with the below embodiments.

Figure 6:
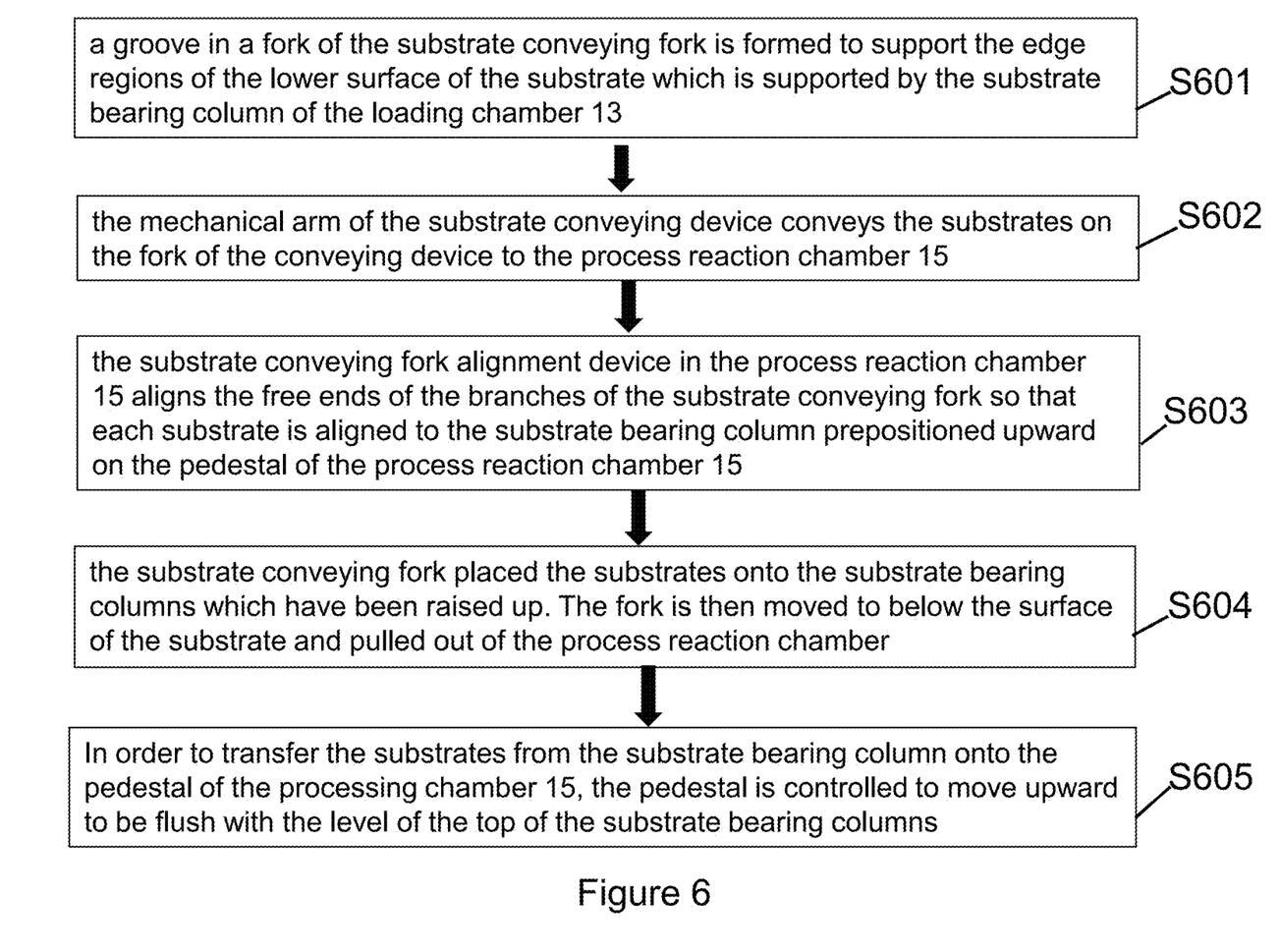
FIG. 6 illustrates a diagram of the process flow of the substrate conveying method in accordance with some embodiments.

As an example, the present application is described in terms of transferring a substrate from a loading chamber to a process reaction chamber. FIG. 6 is a flow chart of a substrate conveying method according to an embodiment of the present disclosure. As shown in FIG. 6, the substrate conveying method comprises the following items:

S601: a groove in a fork of the substrate conveying fork is formed to support the edge regions of the lower surface of the substrate which is supported by the substrate bearing column of the loading chamber 13.

S602, the mechanical arm of the substrate conveying device conveys the substrates on the fork of the conveying device to the process reaction chamber 15.

S603, the substrate conveying fork alignment device in the process reaction chamber 15 aligns the free ends of the branches of the substrate conveying fork so that each substrate is aligned to the substrate bearing column prepositioned upward on the pedestal of the process reaction chamber 15.

S604, the substrate conveying fork placed the substrates onto the substrate bearing columns which have been raised up. The fork is then moved to below the surface of the substrate and pulled out of the process reaction chamber.

It should be noted that, in order to pull the substrate conveying fork out from under the surface of the substrate smoothly, the substrate bearing columns must first be moved into the upward position prior to placing the substrates over the substrate bearing columns of the process reaction chamber.

S605: In order to transfer the substrates from the substrate bearing column onto the pedestal of the processing chamber 15, the pedestal is controlled to move upward to be flush with the level of the top of the substrate bearing columns It should be noted that the substrate transfer method of the above example is to transfer the substrate from the loading chamber to the process reaction chamber. In the process of substrate processing, a plurality of substrate conveying processes are carried out. Each conveying process is basically similar to the conveying process described in the above example. In other embodiments, the substrate conveying device may be utilized to transfer substrates from the initial chamber to the target chamber. When the initial chamber is a loading chamber, the target chamber is a process reaction chamber; when the initial chamber is a process reaction chamber, the target chamber is an unloading chamber The embodiment described above is a specific implementation mode of the substrate conveying method.

As described by the above, the substrate conveying device in accordance with some embodiments has grooves in each branch of the substrate conveying fork and corresponds to the opposite grooves on the adjacent fork to form a pocket for each substrate. A plurality of grooves formed in every two adjacent branches can support a row of substrates. In the conveying process, the substrates are placed inside these pockets formed by the grooves on adjacent braches and can be securely transferred from initial chamber to the target chamber. Meanwhile, by means of the substrate conveying device in accordance with some embodiments, the pedestal in each chamber and the substrate bearing columns which can move up and down, the substrates can be conveyed from one chamber to another without the use of a substrate supporting tray. The conveying of substrates from the loading chamber to the process reaction chamber is an example of this embodiment.

In addition, based on the substrate conveying device in accordance with some embodiments, the substrate conveying method, the pedestal inside the processing chamber and the substrate supporting columns, the substrates can be placed directly onto the pedestal of the process reaction chamber where the substrate can be heated directly by the pedestal. Since the mass of the substrate is small, the substrate can achieve the processing temperature in a relatively short time, thereby improving the processing efficiency of the substrate processing system.

In addition, due to the fact that the substrate can be placed directly onto the pedestal, the substrate supporting tray as described in some prior arts is not needed and the need to clean the substrate supporting tray periodically can also be avoided. In addition, since the substrate must be processed on the front surface and the back surface sequentially, the use of a substrate support tray in this situation will create cross contamination. One or more embodiments described herein eliminate the need for substrate supporting tray used in the prior arts, and therefore eliminate the source of cross contamination of the substrates in sequential processing of the substrates, and therefore improve the yield of the substrate deposition process.

In addition, after the substrate is processed and the substrate is conveyed to the unloading chamber, the substrate can be cooled directly and rapidly as the mass of the substrate is small compared with the substrate supporting tray. Therefore the processing flow of the substrate can be accelerated.

In conclusion, the substrate conveying device and the substrate processing system in accordance with some embodiments can complete the processing of the substrate without the need for a substrate supporting tray. Therefore the disadvantages and contaminations associated with the substrate support tray in the prior art can be eliminated by one or more embodiments described herein. The entire substrate processing system can also be simplified while improving the processing efficiency by reducing heat up and cool down time.

Although particular embodiments have been shown and described, it will be understood that they are not intended to limit the present inventions, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

The invention claimed is:

1. A conveying device for conveying at least a first row of substrates and a second row of substrates, the conveying device comprising:
   a conveying fork having a main body and a plurality of branches, a first end of each of the branches is connected to the main body, and a second end of each of the branches is a free end;
   wherein a first branch of the plurality branches has a first plurality of grooves, and a second branch of the plurality of branches has a second plurality of grooves; and
   wherein one of the first plurality of grooves of the first branch and one of the second plurality of grooves of the second branch are configured to cooperate with each other to support opposite ends of one of the substrates in the first row.

2. The conveying device according to claim 1, wherein a side wall of one of the first plurality of grooves is sloped.

3. The conveying device according to claim 1, further comprising a mechanical arm coupled to the conveying fork.

4. The conveying device according to claim 3, wherein the mechanical arm is configured to move the first row of substrates and the second row of substrates vertically, horizontally, or both vertically and horizontally.

5. The conveying device according to claim 1, wherein the first branch and the second branch are parallel with respect to each other, and wherein a spacing between the first branch and the second branch is less than a cross-sectional dimension of the one of the substrates in the first row.

6. The conveying device according to claim 1, wherein the first plurality of grooves at the first branch, and the second plurality of grooves at the second branch, are configured to support respective ones of the substrates in the first row.

7. The conveying device according to claim 6, wherein a third branch of the plurality of branches has a third plurality of grooves, which are configured to support respective ones of the substrates in the second row.

8. The conveying device according to claim 1, wherein the conveying device is configured to convey the first and second rows of substrates to a process reaction chamber, and/or to remove the first and second rows of substrates from the process reaction chamber.

9. A processing system comprising:
   the conveying device of claim 1, wherein the conveying device is located in a conveying chamber;
   a loading chamber for loading the first and second rows of substrates; and
   a process reaction chamber for carrying out process reaction treatment for the first and second rows of substrates.

10. The processing system according to claim 9, further comprising an unloading chamber for unloading the first and second rows of substrates.

11. The processing system according to claim 10, wherein the loading chamber and the unloading chamber are stacked in an up-and-down arrangement.

12. The processing system according to claim 9, further comprising a first isolating valve between the conveying chamber and the loading chamber, and a second isolating valve between the conveying chamber and the process reaction chamber.

13. The processing system according to claim 9, wherein an inner shape of the process reaction chamber is circular.

14. The processing system according to claim 9, wherein the process reaction chamber comprises pedestals configured to support respectively the substrates in the first and second rows.

15. The processing system according to claim 14, further comprising columns configured to support respectively the substrates in the first and second rows, and wherein a cross sectional area of one of the columns is smaller than a surface area of a respective one of the substrates in the first and second rows.

16. The processing system according to claim 15, wherein the columns are configured to move up to place the substrates in the first and second rows away from the pedestals and/or to move down to place the substrates in the first and second rows towards the pedestals.

17. The processing system according to claim 15, wherein the columns and/or the pedestals are configured provide substrate heating.

18. The processing system according to claim 9, further comprising a positioning device configured to move the conveying fork to vertically align the substrates in the first and second rows with respective supporting structures.

19. The processing system according to claim 18, wherein the supporting structures are configured to provide substrate cooling.

20. The processing system according to claim 9, further comprises a loading device arranged at a front end of the loading chamber, wherein the loading device comprises:
- an additional conveying fork having a main body and a plurality of branches, a first end of each of the branches in the additional conveying fork is connected to the main body of the additional conveying fork, and a second end of each of the branches in the additional conveying fork is a free end;
- wherein a first branch of the plurality branches in the additional conveying fork has a first plurality of grooves, and a second branch of the plurality of branches in the additional conveying fork has a second plurality of grooves; and
- wherein one of the first plurality of grooves associated with the additional conveying fork and one of the second plurality of grooves associated with the additional conveying fork are configured to support one of the substrates in the first row.

21. The processing system according to claim 9, further comprising an unloading chamber, and an unloading device arranged at a rear end of the unloading chamber, wherein the unloading device comprises:
- an additional conveying fork having a main body and a plurality of branches, a first end of each of the branches in the additional conveying fork is connected to the main body of the additional conveying fork, and a second end of each of the branches in the additional conveying fork is a free end;
- wherein a first branch of the plurality branches in the additional conveying fork has a first plurality of grooves, and a second branch of the plurality of branches in the additional conveying fork has a second plurality of grooves; and
- wherein one of the first plurality of grooves associated with the additional conveying fork and one of the second plurality of grooves associated with the additional conveying fork are configured to support one of the substrates in the first row.

22. The processing system according to claim 9, further comprising an additional conveying device in the conveying chamber, wherein the conveying device is configured for conveying the substrates in the first and second rows to the process reaction chamber, and the additional conveying device is configured to remove the substrates in the first and second rows from the process reaction chamber.

23. The conveying device according to claim 1, wherein the conveying fork is configured to obviate a need to use substrate supporting tray.

24. A conveying method performed using the conveying device of claim 1, the method comprising:
- supporting the substrates in the first row by the first and second branches of the conveying fork; and
- lowering the conveying fork to place the substrates in the first row onto respective supporting structures.

25. The conveying method according to claim 24, wherein the supporting structures are in a chamber, and wherein the conveying method further comprises positioning free ends of the branches to align the substrates with the respective supporting structures.

* * * * *